United States Patent [19]

Land

[11] 4,038,077
[45] July 26, 1977

[54] PROCESS COMPRISING DIFFUSION TRANSFER SILVER IMAGE REMOVAL

[75] Inventor: Edwin H. Land, Cambridge, Mass.

[73] Assignee: Polaroid Corporation, Cambridge, Mass.

[21] Appl. No.: 665,562

[22] Filed: Mar. 10, 1976

Related U.S. Application Data

[60] Division of Ser. No. 457,854, April 4, 1974, abandoned, which is a continuation-in-part of Ser. No. 676,510, Oct. 19, 1967, abandoned.

[51] Int. Cl.$^2$ .................. G03C 5/54; G03F 7/02; G03C 5/00; B41M 5/00
[52] U.S. Cl. .................. 96/29 R; 96/29 L; 96/33; 96/35; 101/463; 101/464
[58] Field of Search ............ 96/29 R, 29 L, 33, 35; 101/462, 455, 465, 457, 463, 464

[56] References Cited

U.S. PATENT DOCUMENTS

| 3,015,562 | 1/1962 | Herrick et al. | 96/29 R |
| 3,185,085 | 5/1965 | Herrick et al. | 101/467 |
| 3,186,842 | 6/1965 | De Haas | 96/29 L |
| 3,220,837 | 11/1965 | Land et al. | 96/29 L |
| 3,278,958 | 10/1966 | Regan et al. | 96/29 L |
| 3,385,701 | 5/1968 | Ormsbee et al. | 96/29 L |
| 3,914,125 | 10/1975 | Eikvar | 96/29 L |

Primary Examiner—David Klein
Assistant Examiner—Richard L. Schilling
Attorney, Agent, or Firm—Esther A. H. Hopkins

[57] ABSTRACT

This application relates to procedures wherein a photographic image in silver prepared by diffusion transfer is treated in such a manner as to provide a printing plate or inking master useful in photomechanical reproduction or to provide a non-silver image of the original subject matter, e.g., a document or the like to be reproduced.

17 Claims, 6 Drawing Figures

PROCESS COMPRISING DIFFUSION TRANSFER SILVER IMAGE REMOVAL

CROSS-REFERENCE TO RELATED PATENT APPLICATIONS

This application is a division of copending application Ser. No. 457,854, filed Apr. 4, 1974 by Edwin H. Land and now abandoned; which was a continuation-in-part of application Ser. No. 676,510 filed Oct. 19, 1967, now abandoned.

BACKGROUND OF THE INVENTION

Procedures for preparing photographic images in silver by diffusion transfer principles are well known in the art. In a typical procedure of this nature, an exposed light-sensitive silver halide emulsion containing a developable image is developed with an aqueous alkaline processing composition including a silver halide developing agent and a silver halide solvent to reduce exposed silver halide to silver while forming from unexposed silver halide an imagewise distribution of soluble silver complex which is then transferred at least in part, by imbibition, to a superposed image-receiving layer where it is reduced to image silver to impart thereto a positive silver transfer image. Procedures of this description are disclosed, for example, in U.S. Pat. No. 2,543,181 issued to Edwin H. Land. The image-receiving layer or silver-receptive stratum, as it is often called, may typically provide one of the vigorous silver precipitating environments such as described in U.S. Pat. Nos. 2,698,237 and 2,698,245 issued to Edwin H. Land. The silver-receptive stratum may be contained on a suitable support which may be opaque or transparent. Included on this support comprising the image receiving element may be one or more layers containing ingredients performing specifically desired functions, e.g., waterproofing materials, optical brighteners for enhancing the whiteness of highlight areas of the print, etc.

In typical procedures for preparing silver transfer images in the foregoing manner, the inner surface of the image-receiving layer is tightly adhered to a layer of hydrophobic material which may comprise the support itself or may be positioned between the support and the image receiving layer. The layer for hydrophobic material upon which the image-receiving layer is supported is at least difficultly permeable to water and vapor and is capable of restricting penetration of photographic processing compositions therein, at least for the time that these processing compositions are in contact with the print. In either instance, the image-receiving layer is tightly adhered or bonded to the hydrophobic material to provide a strong laminate which is not easily severable. Diffusion transfer processes employing an image-receiving element including an image-receiving layer supported on a hydrophobic layer, as described above, are disclosed, for example, in U.S. Pats. Nos. 2,719,791, 2,774,667, 2,789,054 and 3,220,835, all issued to Edwin H. Land.

Image-receiving elements prepared by such processes where the silver transfer image is concentrated primarily at the surface of the sheet may be utilized as printing masters. As disclosed in U.S. Pat. No. 3,220,837 issued to Edwin H. Land and Meroe M. Morse, since the silver transfer image is hydrophobic and oleophilic while the underlying sheet is hydrophilic and oleophobic, a greasy ink will adhere only to the silvered areas of the image receiving element. The differentially inked sheet can then serve as a printing master without further treatment.

In carrying out silver transfer processes of the foregoing description, it is extremely desirable that the silver be deposited in the silver-receptive stratum in such a manner that it is retained securely following image formation. Where the silver is deposited primarily at or near the surface, the resulting silver transfer print has been found to be susceptible to loss of density due to rub-off, e.g., upon applying a print coating solution such as is disclosed in certain of the above-mentioned patents and which is employed to wash and protect the transfer image. This unwanted removal of image silver and consequent reduction in density had previously often been observed by me to be more pronounced when the image was formed primarily at or near the surface and in the presence of a wetting agent and/or a print coating solution containing a wetting agent. This removal of silver was most pronounced in areas of dense silver deposit. Since the presence of a wetting agent in some way reduced the adhesion of the transferred silver to the image-receiving element, it was apparent to me that the use of a wetting agent, or at least many kinds of wetting agents, should be avoided in such surface areas where it is desired to form a silver transfer image retained upon an image-receiving element not subject to having a portion removed by subsequent handling.

Although not useful in the aforementioned method of preparing printing masters by silver diffusion transfer processing, I had also previously found that the problem of rub-off can be eliminated or appreciably reduced if the image-receiving element is so formulated that the silver is deposited deeper into the receiving layer. The desired deeper deposit of the silver may be obtained by providing a silver-receptive stratum comprising a plurality of layer containing progressively increasing concentrations of silver-precipitating nuclei as the distance from the surface increases, the greatest concentration of silver precipitating nuclei being in the layer closest to the support or underlayer containing the silver-receptive stratum. Image-receiving elements of this description are disclosed, for example in U.S. Pat. No. 3,567,442 issued to Edwin H. Land.

The present invention is predicated upon the discovery that the tendency of a wetting agent to weaken the adhesion or adherence of transferred silver which had in the past been considered undesirable may unexpectedly be used to advantage in photo-mechanical reproduction systems where printing masters are prepared by silver diffusion transfer processing, especially those where silver is primarily deposited within, rather than on, the image-receiving element.

SUMMARY OF THE INVENTION

According to the present invention, advantageous use is made of a reagent, such as certain wetting agents, detergents, sequestering agents or the like, which can effect selective removal of silver on an image-receiving element, as well as certain portions of the element itself. Image-receiving elements which may be utilized in carrying out the process of the present invention have a silver receptive stratum with a hydrophilic, essentially water insoluble matrix tightly bound to a hydrophobic underlayer. It has now been found that when a silver diffusion transfer image is deposited primarily at or near the interface of the silver-receptive stratum and the underlayer, the introduction of an effective amount of an anti-adhesion reagent into the processing composition and/or the photographic sheet material results in selective removal of the silver and corresponding areas of the silver-receptive stratum when an aqeuous medium consisting essentially of water is applied to the image-receiving element. In the highlight areas where there are no appreciable silver deposits, the tight bond or adhesion of the silver-receptive stratum to the underlaying is not disturbed.

In one aspect of the present invention, this discovery is utilized in a process for preparing an inking master wherein an exposed light-sensitive silver halide emulsion containing a developable image is developed with an aqueous alkaline processing composition; an imagewise distribution of soluble silver complex formed as a function of development in terms of unexposed areas of said emulsion is tranferred, at least in part, by imbibition to a superposed image-receiving element, said element comprising a silver-receptive stratum having a hydrophilic, essentially water insoluble matrix disposed on a layer of hydrophobic material; and said transferred complex is reduced to image silver to provide a relatively dense silver transfer image primarily within said stratum. When this process is carried out in the presence of an effective amount of anti-adhesion reagent, the reagent precludes adhesion of said stratum to the hydrophobic layer therebeneath in areas of relatively dense silver deposit so that these non-adhering areas of said stratum with the silver deposited therein may be removed by the application of an aqueous medium consisting essentially of water. The resultant intaglio image may then be selectively inked by conventional printing techniques with either an oleophilic or a hydrophilic ink to provide a master which may be employed to produce hundreds of ink reproductions of extremely high quality. One aspect of this invention therefore relates to processes, products and apparatus for preparing ink reproductions.

In another aspect of this invention, to be described with more particularity hereinafter, an intaglio image prepared in the foregoing manner may be employed in various systems other than printing to provide a reproduction of the original subject matter.

DESCRIPTION OF THE PREFERRED EMBODIMENT

Figure 1:
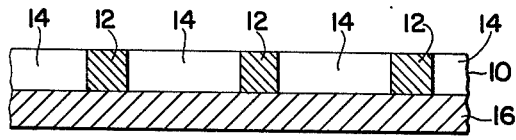
FIG. 1 is an enlarged, diagrammatic, fragmentary sectional view illustrating a silver transfer image.

As was mentioned previously, this invention relates to novel procedures for treating a silver transfer image to provide a non-silver image of the original subject matter. The invention is of particular use in the field of document duplication where it is desired to obtain one or more copies of the original. It is also particularly useful in the preparation of continuous tone images in ink, e.g., in reproducing photographs or the like in printed media and is of broad applicability in these areas.

A primary object of this invention, therefore, is to provide novel procedures of the foregoing description.

Another object is to provide novel procedures for preparing ink reproductions.

Still another object is to provide novel procedures for preparing non-silver reproductions on an image-receiving element on which a silver transfer image had previously been obtained.

Yet another object is to provide novel products and apparatus for use in the foregoing procedures.

Other objects of the invention will in part be obvious and will in part appear hereinafter.

For a fuller understanding of the nature and objects of the invention, reference should be had to the following detailed description taken in connection with the accompanying drawings.

As stated previously, the present invention is predicated upon the discovery that when a relatively dense silver transfer image is formed in a silver-receptive stratum in the presence of one or more anti-adhesion reagents, the stratum which was tightly adhered or bonded to a hydrophobic support or underlayer beforehand may now be removed upon contact with water or with a medium consisting essentially of water.

While it is intended that this invention should not be limited to any particular theory of operation, it is believed that relatively dense concentrations of silver deposited by diffusion transfer in a silver-receptive stratum such as one of those heretofore known in the art ruptures the stratum matrix. An anti-adhesion reagent can then spread into the interstices around the matrix fragments so that these matrix particles will no longer adhere to the underlying layer or support. The fractured portions of the stratum matrix with the silver deposited therein may then be removed with an aqueous medium consisting essentially of water to provide an intaglio or etched image. Although not necessary to the practice of this invention, it has been found that this removal step may be rapidly effected by ligh rubbing, e.g. by lightly rubbing the image-receiving element with a water imbibed facial tissue or similar material. In any event, the water should preferably be applied while the element is still moist from the processing composition, that is, shortly after the silver transfer print is formed, since removal cannot be effected as readily once the print has completely dried.

The anti-adhesion reagent may be present initially in the processing composition, in the image-receiving element and/or in the photosensitive element. The silver-receptive stratum may be superposed with the light-sensitive emulsion prior to or duing development and the processing composition spread between them, or the emulsion may first be impregnated with the processing composition and thereafter placed in superposition according to known techniques.

The light-sensitive silver halide emulsion may comprise any of the gelatino silver halide emulsions heretofore known and commerically available. It may, for example, be a high speed silver iodobromide emulsion.

The image-receiving element upon which silver transfer imaging is effected comprises at least a hydrophilic silver-receptive stratum disposed on a suitable layer or support such as one of those described in aforementioned U.S. Pats. Nos. 2,698,237 and 2,698,245. Although the stratum may contain water soluble components such as silver precipitating nuclei, the stratum matrix is water insoluble, preferably comprising a macroscopically continuous vehicle or matrix of an inorganic material such as silica. The minimum average size of the particle in this matrix is of colloidal rather than of molecular dimensions, being sufficiently small to be indistinguishable as particles by the naked eye when formed into a layer. The siliceous material comprising the matrix may contain, the colloidal of finely divided condition, oxides of silicon, particularly those in the form of silica acids like silica aerogel, and mineral silicates such as mica and talc. As examples of useful siliceous materials, mention may be made of Syton (trademark of Monsanto Chemical Co. for a milky-white, stable, 15% colloidal disperison of silica in water, sp. gr. 1.10); Santocel (trademark of Monsanto Chemical Co. for a light-weight porous silica aerogel from which the water has been removed by a process that does not destroy the original gel structure, apparent density, 6.5–9.75 lb./cu. ft.); and Ludox (trademark of E.I. duPont, deNemours & Co. for an aqueous colloidal sol containing approximately 30% $SiO_2$ with less than .05% $Na_2O$ as stabilizer, sp. gr. 1.21).

The silver-receptive stratum preferably further includes a silver recipitating nuclei providing a vigorous silver precipitating enviroment for facilitating reduction of silver halide transferred thereto to image silver. As examples of silver precipitating nuclei, mention may be made of heavy metal sulfides and/or selenides, the colloidal noble metals, organic thio compounds, etc. Suitable silver-receptive strata comprising silver precipitating nuclei dispersed in a hydrophilic matrix, e.g., a siliceous material, are disclosed, for example, in U.S. Pat. Nos. 2,698,237 and 2,698,245 issued to Edwin H. Land.

The silver-receptive stratum may be contained on a suitable base sheet or support, e.g., paper, glass, or plastic. Preferably, there is interposed between the silver-receptive stratum and the support a water-impermeable stratum. This water-impermeable stratum serves to make possible selective inking in the manner to be described with more particularly hereinafter. This water-impermeable stratum may, be composed of a member of the class of hydrophobic materials known to adhere well to the silver-receptive stratum, e.g., one of the cellulosic esters such as cellulose nitrate, cellulose acetate, cellulose butyrate, cellulose propionate, cellulose acetate butyrate, cellulose acetate propionate; a rubbery polymer such as polyvinyl butyral, etc. Image-receiving elements including strata of this description are disclosed, for example, in U.S. Pat. No. 2,823,122 issued to Edwin H. Land. Where this stratum is of sufficient strength, it will be appreciated that the support may be eliminated, if desired. It will also be appreciated that the image-receiving element may include other layers or strata in addition to those named above, providing specific designated functions. In any event, in the embodiment of this invention relating to ink reproductions, the silver receptive stratum should be contained on a hydrophobic layer of support.

The processing composition, as heretofore noted, comprises, at least a solution of an alkaline material, e.g., sodium or potassium hydroxide; a silver halide solvent, e.g., sodium or potassium thiosulfate; and a silver halide developing agent, e.g., one of the known silver halide developers of the ortho-hydroxphenol, para-hydroxyphenol, ortho-aminopheno, or p-amino phenol series, such as hydroquinone, amidol, metol, catechol, pyrogallol, etc. The developing agent is preferably a high energy developer, e.g., 2,4-diamino-ortho-cresol, 4-amino-2,6-dimethyl-phenol, 2,6-dimethoxy-4-amino phenol, or others such as those disclosed in U.S. Pats. Nos. 3,091,530, 3,108,001, 3,257,207 and 3,276,873.

These ingredients may be present initially in the aqueous medium for the processing composition or, alternatively, any or all of the ingredients may be present initially in the photosensitive and/or the image-receiving element, e.g., by encapsulation, as discrete coatings, etc., in which case development is initiated by contacting the respective elements with the aqeuous medium to form the processing composition. Alternatively, as described in U.S. Pat. No. 3,362,823 issued to Edwin H. Land, development may be effected by impregnation with a non-alkaline processing composition and the alkalinity required to initiate development may be generated in situ electrolytically at some time after impregnation. The processing composition may also contain other reagents such as viscous film-forming material, for example, sodium carboxymethyl cellulose, hydroxyethyl cellulose, etc., preservatives, antifoggants and the like. In the preferred embodiment, the anti-adhesion reagent is contained initially in the processing composition.

It will be appreciated that the anti-adhesion reagent for the initiating removal of the transferred silver and corresponding areas of the silver-receptive stratum should be innocuous, i.e., should not adversely affect the development step by which the silver transfer image is formed, at least to any appreciable extent, or, if not normally innocuous, it should be treated in such a way as to be innocuous.

A preferred group of materials from which antiadhesion reagents may be selected are those classified as detergents, wetting agents and sequestering agents. Although not all substances tried from this group worked successfully under the process conditions employed herein, many of them did initiate removal in the foregoing manner. In this regard mention may be made of sequestering agents such as ethylenediaminetetraacetic acid, ethylenediaminetetraethanol, polyphosphates, e.g., sodium hexametaphosphate or sodium polyphosphate, and compositions containing the same, e.g., commerically available dishwashing compositions such as Finish and Electrasol (Economics Laboratory, Inc.), Calgon, Calgonite and Sparkleen (Calgon Corporation); detergents and wetting agents such as Renex (trademark of Atlas Powder Co. for a group of non-ionic, non-forming detergents which are polyoxyethylene esters of mixed fatty and resin acids), e.g., Renex 20, Renex 30 and Renex 650, commercially available liquid detergents such as Ivory Liquid Detergent and Joy (Proctor and Gamble), etc.; disodium salt of tetrahydroxysuccinic acid, polyethylene glycol 425, monobasic ammonium phosphate, sodium orthosilicate, Plurafac D-25, Plurafac RA-40, decaglycerol monlaurate, and others.

The amount of reagent employed may vary over wide limits and is not capable of precise definition. However, the selection of operative amounts will be readily ascertainable by those skilled in the art in the light of the present description, including the illustrative examples. Accordingly, as used in the appended claims, the term "effective amount" denotes the amount of reagent necessary to accomplish the desired initiation removal.

It has been found that to render the silver receptive stratum removable, a relatively dense silver deposit is necessary. The dense silver deposits may be characterized as "black" image areas resulting from a silver deposit of a density of, say, 1.0 or greater, as distinguished from so-called "grey" areas or intermediate gradations of lesser optical density corresponding to partially exposed areas of the emulsion.

Figure 2:
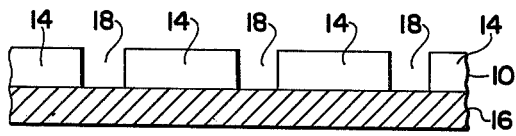
FIG. 2 is a similar view illustrating the image of FIG. 1 after treatment in accordance with this invention.

The practice of this aspect of the invention by which an intaglio or etched image is formed may be illustrated by reference to the accompanying drawing. FIG. 1 shows a silver transfer image formed on an image receiving element comprising a silver-receptive stratum 10 contained on a suitable layer or member 16. The image is shown to have areas of silver 12 and non-image or highlight areas 14. As shown in FIG. 2, following treatment in accordance with this invention with water or an aqueous medium consisting essentially of water at some time after image formation, removal of silver and areas of stratum 10 corresponding thereto is selectively effected, the removed portions being indicated at 18.

The light-sensitive silver halide emulsion may be contained on a support or layer other than the bearing the silver-receptive stratum, i.e., the emulsion and the silver-receptive stratum may be present initially on separate elements or sheets, in which case the respective elements are brought into superposition during processing to provide the silver transfer image. Alternatively, they may be present initially as a unitary film unit. For example, the emulsion layer may be disposed over the silver-receptive stratum, in which case the emulsion and silver-receptive stratum are separated or peeled apart following processing to reveal the silver transfer image. If found desirable or expedient to do so, various materials may be employed to facilitate clean separation of the emulsion layer and the processing composition from the silver-receptive stratum. These materials may be contained in a stripping layer disposed between the emulsion layer and silver-receptive stratum or these materials may be present in the emulsion layer. Unitary film units of the foregoing description including a reagent (deacetylated chitin) in the emulsion layer to enhance clean separation are described and claimed, for example, in U.S. Pat. No. 3,003,875 issued to William H. Ryan.

Unitary film units of this description may be processed by spreading the processing composition in a substantially uniform layer over the photosensitive emulsion layer. The processing composition then permeates the emulsion to initiate development and to effect silver transfer image formation. To facilitate spreading of the processing composition in a substantially uniform layer, a spreader sheet or the like may be employed.

Figure 3:
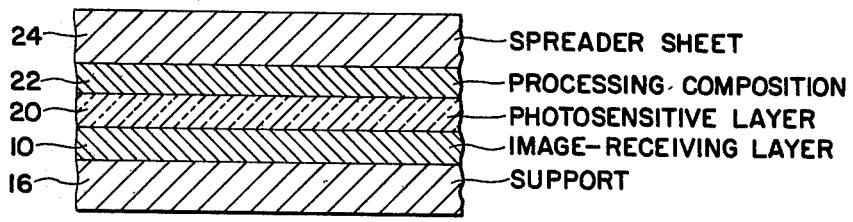
FIG. 3 is a similar view of a unitary film unit useful in the practice of this invention during one stage of processing thereof.

A film unit of this description during processing thereof is illustrated in FIG. 3. As shown therein, such a film unit may contain a support 16 having thereon an image-receiving layer 10, and a photosensitive silver halide emulsion layer 20. Development of an exposed film unit of this description is shown to be accomplished by spreading of a processing composition 22 over the surface of the photosensitive layer 20 with the aid of a spreader sheet or similar element 24. If desired, the processing composition may be spread between layers 20 and 22 in lieu of applying the composition in the manner illustrated. To facilitate application, the processing composition may be confined initially in a rupturable or frangible container or pod, e.g., of the character described in U.S. Pat. No. 2,543,181 issued to Edwin H. Land. Where ink reproductions are contemplated, support 16 should be hydrophobic, or, alternatively, a hydrophobic layer should be situated between the support and layer 10.

Where the image-receiving element comprises a hydrophilic silver-receptive stratum disposed on a hydrophobic layer or stratum, silver transfer image formed thereon which has been treated in the foregoing manner to effect removal of silver and corresponding areas of the silver-receptive stratum has been found to be an excellent inking master for producing ink copies of the original by conventional techniques. Due to the differential in ink receptivity provided by the hydrophilic character of the silver-receptive stratum and the hydrophobic character of the layer therebeneath, selective inking may be effected with a hydrophilic ink or with a standard greasy or oleophilic ink when the stratum and underlayer are respectively oleophobic and oleophilic. This inking is preferentially effected in image areas, i.e., areas where the silver image and associated stratum material have been removed. Ink from the thus inked master may then be transferred to one or more copy sheets in succession to provide excellent ink reproductions exhibiting image areas with dense ink deposits and clean white highlight areas. As disclosed in the following illustrative examples, hundreds of ink copies of similar quality have been successfully prepared by successively inking and transferring the ink to copy paper.

EXAMPLE 1

A high speed silver iodobromide emulsion (from a Polaroid Type 51 Land film) was exposed to line copy (printed matter) and then developed by spreading between the thus exposed emulsion and a superposed image-receiving element comprising a siliceous silver-receptive stratum 0.5–0.75 micron thick containing silver-precipitating nuclei disposed on a polyvinyl butyral hydrophobic layer (such as disclosed in the aforementioned U.S. Pat. No. 2,823,122) at a gap of 0.0022 inch with a processing composition containing the following proportions of ingredients:

| | |
|---|---|
| Water | 8,289.0 cc. |
| Hydroxyethyl cellulose (high viscosity) | 366.0 g. |
| Sodium sulfite | 260.0 g. |
| Sodium hydroxide | 425.0 g. |
| Sodium thiosulfate | 741.0 g. |
| 6-nitrobenzimidazole | 10.8 g. |
| 2,6-dimethyl-p-aminophenol | 270.0 g. |
| Potassium iodide | 15.0 g. |
| Monobasic ammonium phosphate | 45.0 g. |

After an imbibition period of fifteen seconds the image-receiving element was separated to reveal a dense silver tansfer image. This image was then rubbed very lightly with a water imbibed facial tissue to remove the silver transfer image and corresponding areas of the silver-receptive stratum.

EXAMPLE 2

The procedure of Example 1 was repeated with analogous materials, the image-receiving element employed being the receiving element from a Polaroid Type 107 Land film, comprising a siliceous silver-receptive stratum containing silver precipitating nuclei disposed on a hydrophobic layer, each time substituting for the monobasic ammonium phosphate in the processing composition one of the following ingredients, the quantity indicated being the amount of each ingredient for the given amount of developing composition:

| | |
|---|---|
| Finish | 0.3 g./10 cc. |
| Electrasol | 0.3 g./10 cc. |
| Calgon | 0.3 g./10 cc. |
| Sparkleen | 0.3 g./10 cc. |
| Calgonite | 0.3 g./10 cc. |
| Ivory Liquid Detergent | 2.0 cc./8 cc. |
| Joy | 0.3 g./10 cc. |
| ethylenediaminetetraacetic acid | 0.3 g./10 cc. |
| ethylenediaminetetraethanol | 3.0 cc./10 cc. |
| disodium salt of tetrahydroxy succinic acid | 0.3 g./10 cc. |
| Renex 20 | 2.0 cc./10 cc. |
| Renex 30 | 2.0 cc./10 cc. |
| Renex 650 | 2.0 cc./10 cc. |
| Sodium orthosilicate | 0.6 g./10 cc. |
| Plurafac D-25 | 1.5 cc./10 cc. |
| Plurafac RA-40 | 1.5 cc./10 cc. |
| Decaglycerol monolaurate | 3.0 cc./7 cc. |
| Sodium tripolyphosphate | 0.6 g./10 cc. |
| Sodium metaphosphate | 0.6 g./10 cc. |

In each instance, lightly rubbing the image-receiving element with a water imbibed facial tissue removed the silver image and corresponding areas of the stratum.

EXAMPLE 3

A silver transfer image treated in the foregoing manner to effect silver removal was swabbed with a solution of methylene blue. The methylene blue colored the hydrophilic silver-receptive stratum remaining after removal but did not color the hydrophobic underlayer to provide a negative image in terms of the white non-colored areas corresponding to areas where silver was intially deposited. Apart from negative image formation, this selective coloring further illustrates that the silver-receptive stratum was removed along with the silver selectively in areas of silver deposit.

EXAMPLE 4

In lieu of adding monobasic ammonium phosphate to the processing composition as in the procedure described in Example 1, the image-receiving element was treated prior to image formation with a 5% solution of this compound. Following processing by spreading the processing composition from a Polariod Type 51 Land film unit between the exposed emulsion and the thus impregnated image-receiving element, a silver transfer image was obtained. This silver transfer image, as in the preceding examples, appeared similar to silver transfer images obtained in the usual manner. However, when this image was rubbed with a water imbibed facial tissue, the silver image was removed.

EXAMPLE 5

To a solution containing 10.0 cc. of a high speed silver iodobromide emulsion, 48.0 cc. of gelatin, 3.6 cc. of a 1.0% aqueous soltuion of Aerosol OT (trademark of American Cyanamid Co. for dioctyl ester of sodium sulfosuccinic acid) and 28.4 cc. of water was added 0.0247 g. of monobasic ammonium phosphate. The resulting solution was coated onto a standard cellulose acetate support sheet to provide a calculated coverage of 3 mg. per square foot of monobasic ammonium phosphate, the coating solution having a pH (wet) of 5.76. The resulting photosensitive element was exposed and developed in the manner described in Example 1, except that the processing composition contained no monobasic ammonium phosphate or any other antiadhesion reagent. The resulting silver transfer image again appeared similar to silver transfer images obtained in the usual manner. However, when the image was rubbed with a water imbibed facial tissue, the silver image was removed.

EXAMPLE 6

Silver transfer images treated in the manner described in each of the foregoing examples were employed as inking masters on a standard Multilith Offset Duplicating machine commercially available from Addressograph-Multigraph Corporation in standard procedures for such machines. The inking master was first swabbed with Platex (a solution for remoistening and cleaning the surface of paper masters manufactured by Addressograph-Multigraph Corporation and understood to contain water, glycerine, formaldehyde, and monobasic ammonium phosphate). The fountain solution (a solution commonly employed in offset printing machines to enhance selective inking) was Colitho 365 High Speed Solution (Columbia Ribbon & Carbon Inc.), a universal plate etch and fountain solution for direct image and sensitized paper acetate and metal offset plates. The master was attached to the roller and the paper feed was charged with standard copy paper. Formulator No. 71 Black (Glenn Killian Color Co.), a standard slow drying black ink, was applied to the ink form roller. The machine was put into operation and copy paper was fed at a rate of approximately 9000 per hour. Aftrr several hundred copies had been reproduced, the machine was arbitrarily stopped. The various ink copies produced in each instance were of remarkably high quality, the image areas being clearly defined sharp black ink reproductions, the highlight areas being clean. Examination indicated that the copies were of equal quality, e.g., the last, the first and the middle copies were substantially identical in quality. Following removal of the inking master and storage for a period of time, examination indicated that the inking master could be employed again in an inking run.

The procedure described in Example 6 was repeated, using various other commercially available oleophilic inks as substitutes for the ink employed in that example. The results obtained were substantially identical. Similar results were also obtained when a water swab and water fountain solution were used in lieu of the Platex and Colitho 365 described in Example 6. In one run, approximately 1400 ink copies of substantially identical quality were run off.

It was also found that the removal of the dense silver deposits and corresponding areas of the silver-receptive stratum may be accomplished by the aforementioned treatment with an aqueous medium while the image is on the roller of the inking apparatus. In other words, the silver transfer image may be trasferred directly to the printing apparatus, following silver transfer image formation, and treated at this point to effect image removal by standard printing procedures, thereby obviating the previously described step of wiping the image with a wet facial tissue.

In the foregoing illustrative examples, the silver halide emulsion and the silver-receptive stratum were contained on separate supports, i.e., as separate elements. The following example illustrates the preparation and use of a unitary film unit such as is shown in FIG. 3 in the practice of this invention.

EXAMPLE 7

A unitary film unit was prepared by coating onto the surface of the image-receiving element from a Polaroid Type 107 Land film, a solution containing 30.0 cc. of water, 4.0 cc. of 4% deacetylated chitin solution, 0.3 cc. of 25% Triton X-100 (trademark of Rohm & Haas Co., for a nonionic isooctyl phenyl polyethoxy ethanol dispersing agent), 0.25 cc. of Renex 30, and 11.0 g. of a high speed gelatino silver iodobromide emulsion containing a gel to silver ratio of 0.6:1.0 to provide a photosensitive layer containing about 0.25 g. of silver per square foot of surface area. The resulting unitary film unit was photoexposed and then developed by spreading between the surface of the thus exposed element and a superposed paper spreader sheet at a gap of 0.0030 in. a processing composition similar to that recited in Example 1. Following an imbibition period of 15 seconds the cover or spreader sheet was removed. The spreader sheet, the emulsion layer and spent processing composition all adhered together so that the removal of the spreader sheet provided clean separation to reveal a clean silver transfer image having dense silver image areas and clean white highlight areas.

EXAMPLE 8

Treatment of the image prepared in Example 7 to effect removal of the silver and subsequent use thereof as an inking master in the manner described in the preceding illustrative examples provided comparable ink copies of excellent quality.

The foregoing illustrative examples relate to the preparation of ink reproductions of subject matter containing only two densities with no intermediate gradations or so-called "grey areas", e.g., printed matter. By the use of halftone screens, continuous tone ink reproductions of remarkable quality may be obtained.

Halftone screens for reproducing photographs or the like in newspapers, magazines and other printed matter are well known in the art. Such a screen may, for example, comprise two sheets of glass, the adjacent surfaces of which are ruled with fine parallel lines, the lines of one face being perpendicular to the lines of the other to provide a fine grating. These uniformly spaced lines may typically range from 45 to 500 per inch.

When a photosensitive element is exposed to continuous tone subject matter through such a screen, the intermediate gradations are typically reproduced as tiny dots. The fidelity of the dots, that is, the ability to retain the form and dimensions of the dots, to a large extent determines the fidelity of the ink reproduction.

The following example illustrates the use of a halftone screen to prepare a continuous tone reproduction in accordance with this invention.

EXAMPLE 9

A continuous tone silver transfer image was prepared in the manner described in Example 1 by exposing the photosensitive emulsion to continuous tone subject matter through a halfone screen having approximately 120 lines per square inch. The resulting continuous tone silver transfer image having intermediate gradations in terms of the dots obtained by use of the screen was of excellent fidelity and quality. The resulting silver transfer image was rubbed with a facial tissue wetted with water and empolyed in the procedure described in Example 6 to provide hundreds of identical continuous tone ink reproductions of continuously high quality corresponding to that obtained in the previous examples pertaining to line copy having only two densities. When inspected side by side, a continuous tone silver transfer image prepared in this manner and a corresponding ink copy appeared identical. The intermediate gradations in ink paralleled those on the silver print providing the inking master. When observed under a magnifying glass, the tiny ink dots providing these gradations were of exceptional fidelity, retaining their form and size.

From the procedure described in this example, it will be seen that the present invention provides a simple and efficient procedure for reproducing continuous tone subject matter in printed media, the involved steps consisting only of photographing through a halftone screen and treatment with an aqueous medium to provide a printing master. If desired, the photosensitive layer may be pre-exposed through a halftone screen to provide a pre-screened negative.

While thus far reference has been made to the preparation of inked reproductions wherein the inked portions correspond to areas on the inking master where the silver transfer image was deposited in relatively dense concentrations, it has also been found that the silver-receptive stratum may be inscribed prior or after silver removal with an oleophilic ink-receptive material and this inscription will also be reproduced in ink. Thus, for example, it has been found that indicia or notations made on the silver-receptive stratum, e.g., before or after silver transfer image formation, with a typewriter containing a conventional ribbon, a pencil, grease pencil or the like, will also appear on the ink reproduction. Likewise, the silver-receptive stratum may be removed, as by scratching with a sharp instrument, to render the hydrophobic underlayer ink receptive. It will therefore be apparent that the present invention permits one to make notations, for example, descriptive or identifying marks, with standard available marking elements, which notations will appear in the ink reproduction along with areas of ink deposits corresponding to the areas in which image silver was previously deposited on the master. However, due to the nature of the materials used to prepare these notations, that is, their tendency to rub off and/or to lose their character of ink receptivity, it has not been possible to obtain as many copies from a single master containing these notations. In any event, the present invention makes it possible to obtain a limited number of copies by this procedure.

In the preceding portion of the description, including the illustrative examples, inks have been employed to selectively ink the image-receiving element's hydrophobic underlayer. This of course presupposes that the silver-receptive stratum is oleophobic and the underlayer is oleophilic. It will be apparent that the element's oleophilicity is not a factor when a hydrophilic or watery ink is employed to effect selective inking of the silver-receptive stratum. Thus, it is within the scope of this invention to employ either class of inks to effect inking of either the hydrophilic or hydrophobic areas, depending upon whether one desires direct or reverse ink copies.

Another embodiment of this invention relates to various procedures for preparing single copies of the original subject matter wherein the image areas are in other than silver. While not necessarily limited thereto, since this aspect of the invention is of particular interest in the field of document duplication, this aspect of the invention will best be illustrated by reference to this field.

Silver diffusion transfer techniques in general are effective techniques for preparing copies of documents or the like. However, silver images of the original tend towards instability and generally require some after-treatment such as washing and/or coating to protect the image.

In one aspect of the invention, an inking master such as prepared in the foregoing illustrative examples is employed as the primary image to provide a single highly stable copy of the document or the like.

By way of illustration, a film unit for preparing silver transfer images in accordance with this invention is advanced to an exposure station where a developable image of the document to be reproduced is recorded. Following exposure, the unit is advanced to a developing station where a silver transfer image is formed. The silver image is then advanced, in order, to a station where removal of silver and corresponding areas of the silver-receptive stratum is accomplished, and finally to an image-providing station where a suitable stable oleophilic color-providing material such as an ink is applied to provide a stable copy of the original in terms of the applied color-providing material. The various procedural steps at the respective stations may be performed by hand or, in lieu thereof, means may be provided for automatically accomplishing the same.

Figure 4:
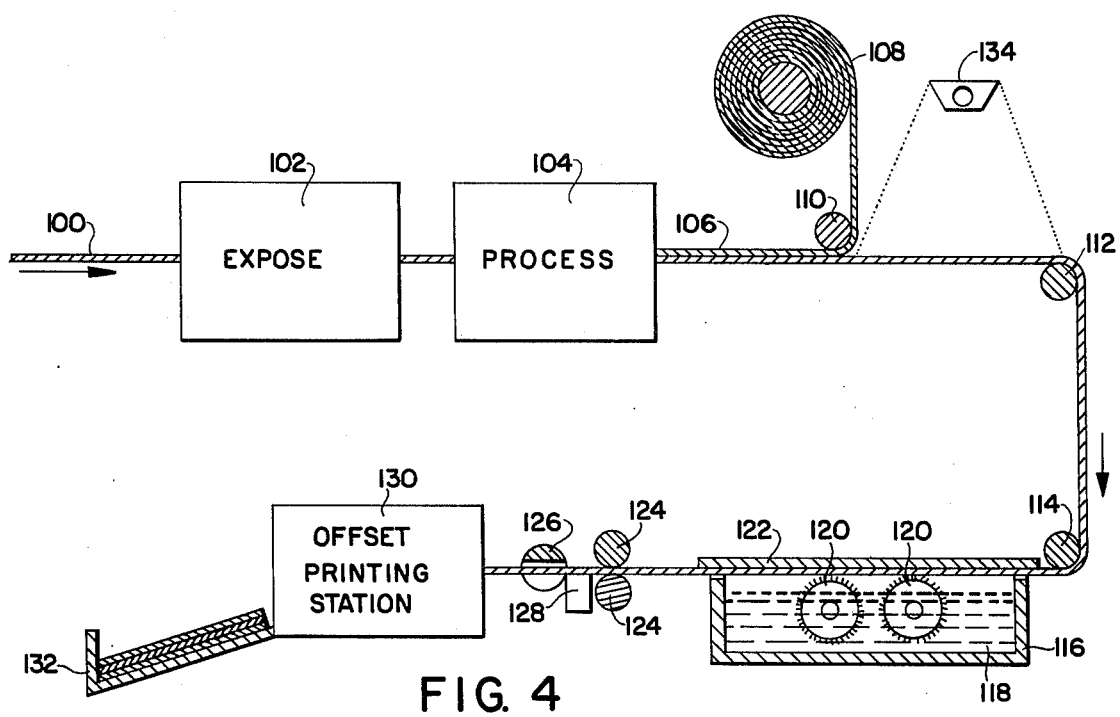
FIG. 4 is a schematic view of apparatus contemplated for use in the preparation of ink reproductions according to this invention.
Figure 6:
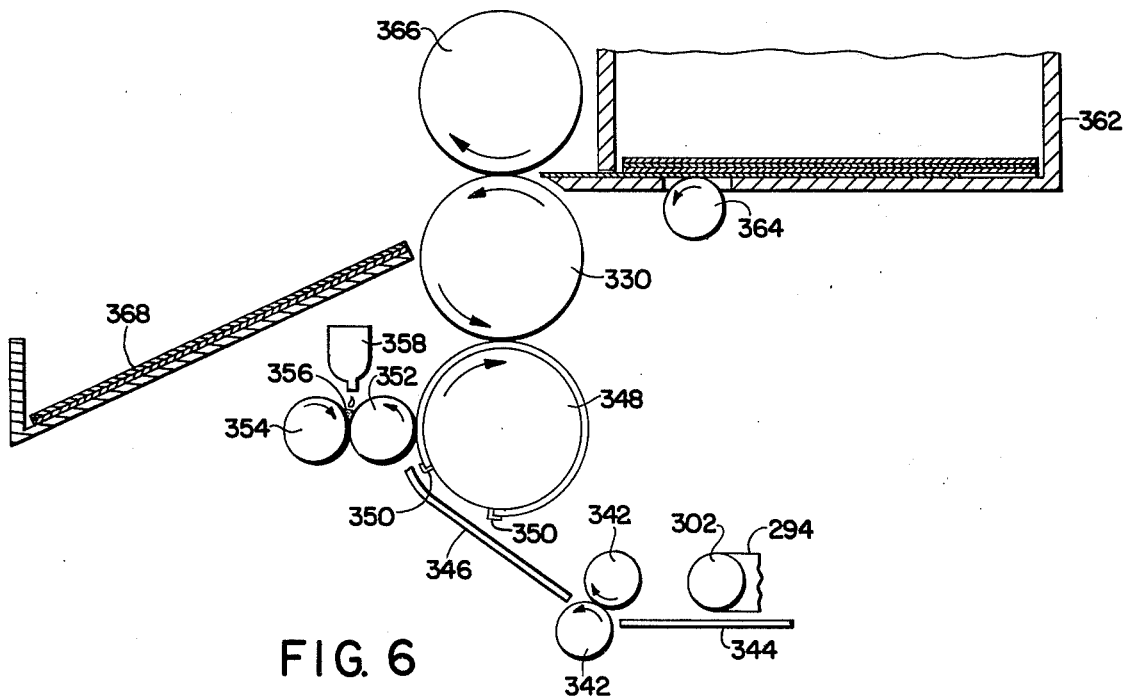
FIGS. 5 and 6 together represent a sectional, elevational, partially schematic view illustrating one form of apparatus useful in the practice of this invention.
Figure 5:
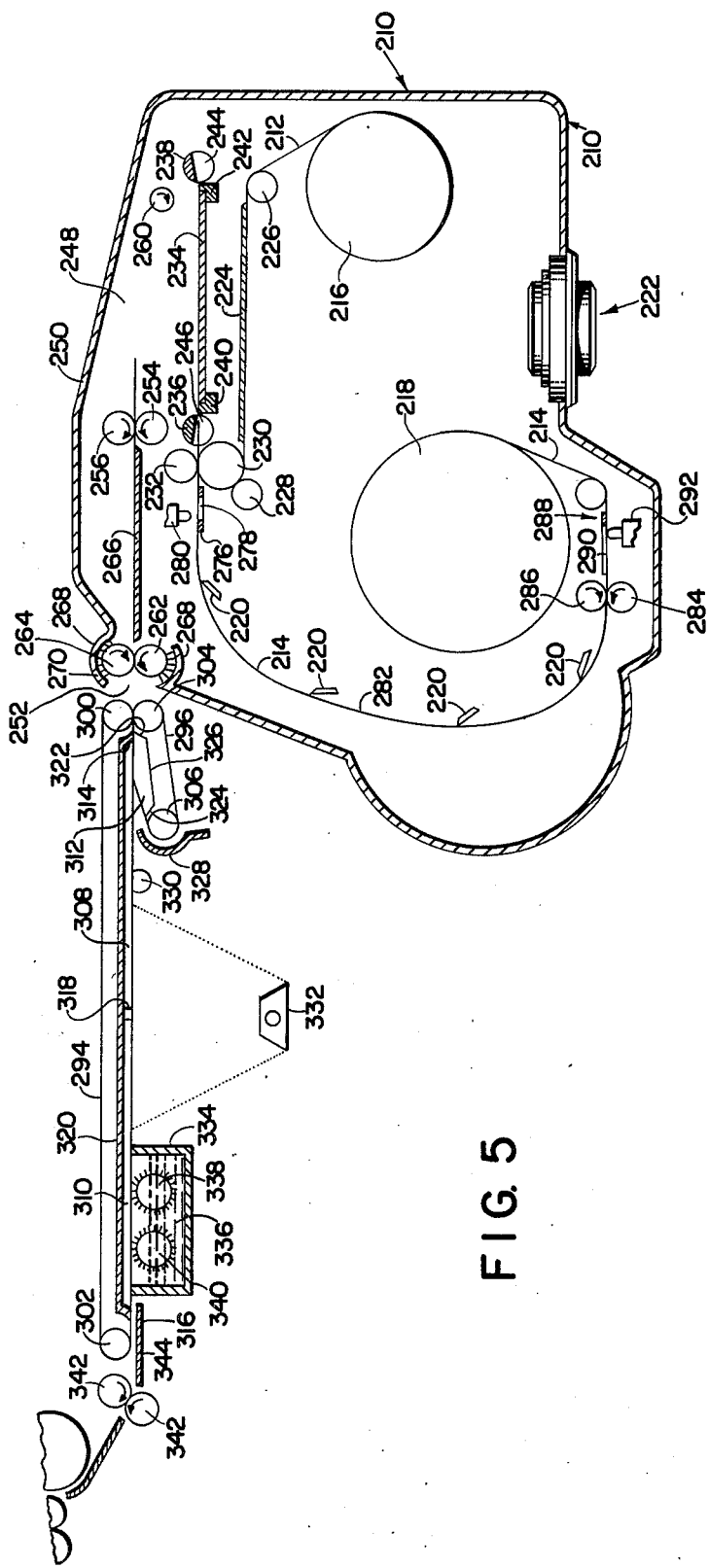

Apparatus useful in the practice of this invention to prepare one or more ink reproductions is illustrated in FIGS. 4–6. As shown schematically in FIG. 4, such an apparatus embraces means for exposing, processing, washing to remove silver and corresponding areas of the silver-receptive stratum, and printing means for preparing ink reproductions. In operation, a photosensitive element 100 is advanced to exposure station 102, e.g., a conventional camera lens system, where it is photoexposed and then advanced to a processing station 104 where it is processed by spreading of a processing fluid between the thus exposed element and a superposed sheet 106. Where the silver-receptive stratum and the photosensitive emulsion layer are confined on separate supports, sheet 106 would comprise the image-receiving element including the silver-receptive stratum. Where the photosensitive layer is contained on a unitary element such as is disclosed in FIG. 3, sheet 106 may comprise a cover sheet to facilitate spreading of the developing composition. In the latter embodiment, the cover sheet is taken up following processing on a spool 108. To this end, suitable guide rollers 110 are provided to facilitate separation of the respective sheets and taking up of sheet 106 on spool 108. Where separate elements are employed, it will be apparent that the arrangement of elements would be reversed so that the photosensitive element would be taken up on spool 108 and the image-receiving element containing the resulting silver transfer image would proceed to the next station in the manner indicated by the arrows. In either instance, the thus formed silver transfer image is conveyed in the direction of the arrows by means of suitable guide means shown in the form of rollers 112 and 114 to a tank 116 containing an aqueous liquid 118 for effecting removal of the silver and corresponding areas of the silver-receptive stratum. To effect this removal, rollers 120 of a suitable soft porous material are provided. These rollers are shown to be partially immersed in fluid 118 and are rotatable therewithin to provide a constant source of the fluid on the roller for application to the silver transfer image to effect the desired removal. To insure contact with rollers 120, a suitable cover plate or the like 122 is provided.

Following this treatment, the sheet material is fadvanced by means of feed rollers 124 to a knife 126 cooperating with a suitable anvil 128 to sever the sheet material and thereby provide an inking master which may then be transferred to a suitable printing station 130 such as shown in FIG. 6 and described with more particularity hereinafter, where it is employed to produce one or more ink reproductions on copy paper or the like which may be subsequently collected in a bin or the like 132. It will be appreciated that suitable means may be provided to perform the operations at the various stations automatically and means may also be provided for automatically advancing the sheet material from one station to another. If desired, a viewing station, shown schematically at 134, may be provided to view the silver transfer image at some point between silver image formation and removal thereof.

Apparatus for exposing a film unit and developing the thus exposed film unit in the foregoing manner is per se old in the art and comprises no part of the present invention. FIG. 5 shows the modification of such apparatus to the present invention, the apparatus for exposing and developing of the film being described and claimed in U.S. Pat. No. 2,963,953. As shown in FIG. 5, the exposing and processing apparatus includes a lighttight housing 210 in which is mounted a supply of a photosensitive sheet 212 and another sheet 214 which in the form shown, comprises an image-receiving element. [Where a unitary film unit such as shown in FIG. 3 is employed, the other sheet 214 may comprise a suitable cover sheet.] Sheet 212 is preferably coiled on a spool 216 of conventional design located within housing 210 adjacent one end thereof and sheet 214 is preferably coiled on a somewhat larger spool 218 of conventional design mounted in the lower portion of housing 210 toward the other end thereof. Spool 218 may be larger than spool 216 in order to accommodate the greater cross-sectional bulk of sheet 214, due in large measure to a succession of containers 220 provided thereon for carrying a liquid processing composition. As shown, containers 220 are affixed to sheet 214 at substantially regularly spaced intervals from a location adjacent its leading end toward its trailing end, the containers being so spaced that one container is associated with one image-receiving area. Each container is provided with a rupturable mouth facing from the trailing end of sheet 214, this mouth being adapted to eject processing composition when opposed compressional forces are applied to the container.

A conventional lens and shutter assembly, designated at 222, is mounted on a lower wall of housing 210 in position to direct light along a path between spools 216 and 218. As a means for positioning successive frames of sheet 212 for exposure to actinic light from the lens of assembly 222, there is provided such means as a guide plate 224 positioned above and between spools 216 and 218 and with its lower surface substantially in the focal plane of the lens. Successive frames of sheet 212 are advanced in contact with the lower surface of plate 224 and are thereby positioned for photoexposure. A pair of guide rollers 226 and 228 are provided at opposite ends of plate 224 for retaining sheet 212 in contact with the lower surface of guide plate 224, sheet 212 being advanced along a path extending from spool 216 around the upper portion of guide roller 226 and across plate 224 to guide roller 228.

To effect the processing of developable images in frames of sheet 212, there are provided pressure-applying means in the form of a pair of rollers 230 and 232 between which sheets 212 and 214 are advanced in superposition. Advancement of a frame of sheet 212 and an associated image-receiving area of sheet 214 between the rollers causes ejection of the processing composition from the mouth of a container 220 and spreading of the processing composition between the frame and area to form a sandwich. Within the sandwich the latent image in the frame is processed and a positive silver image is formed in the image-receiving area. Rollers 230 and 232 are mounted in juxtaposed relation above and adjacent one end of guide plate 224, roller 230 being positioned closely adjacent or in contact with guide roller 238. Resilient means (not shown) are provided for urging rollers 230 and 232 toward one another so that they apply compressive pressure to the sheets as the latter are advanced between the juxtaposed surfaces of the rollers. In practice, sheet 212 extends from guide plate 224 between rollers 228 and 230 into superposition with sheet 214 between rollers 230 and 232 to form a sandwich.

A generally flat elevator platform 234 is provided, normally positioned above guide plate 224 in a plane substantially tangent to the surfaces of rollers 230 and 232 and in position to support a sandwich comprising sheets 212 and 214 as the sandwich is advanced from between rollers 230 and 232. Cutting means are provided adjacent each end of platform 234 for severing the portion of the sandwich supported thereon, and including a superposed frame and area, from the leading end portion of the sandwich, which includes a collapsed container 220, and from the leading portions of sheets 212 and 214 extending between rollers 230 and 232. The two cutting means mounted at opposite ends of platform 234 are substantially the same and include blades 236 and 238 and anvils 240 and 242 mounted, respectively, adjacent rollers 230 and 232 and at the opposite ends of platform 234. Platform 234, when in its normal position, is seated at its ends on portions of anvils 240 and 242 and with its upper surface substantially flush with the upper or support surfaces of the anvils. Each blade includes a pair of disklike elements 244 at its opposite ends and a cutting edge 246 extending between the disklike elements. Blades 236 and 238 are mounted for pivotal movement about axes extending substantially through the central portions of disklike elements 244 and lying substantially in the plane of the upper support surfaces of platform 234 and anvils 240 and 242. A suitable receptacle may be provided adjacent blade 238 between the latter and the end wall of the housing to receive the end portions severed from the successive sandwiches.

In the upper portion of housing 210, there is provided a processing chamber, generally designated at 248, located above elevator platform 234 and in which each of successive sandwiches formed by rollers 230 and 232 is permitted to remain during a predetermined processing period. Processing chamber 248 is defined by an upper wall 250 of housing 210 and extends from one end of the housing adjacent cutting blade 238 at the end of platform 234 spaced furthest from rollers 230 and 232, to the opposite end of housing 210 wherein there is provided an exit passage 252 through which processed sandwiches may be ejected. As a means for controlling the processing time during which each sandwich is permitted to remain within processing chamber 248, there is provided a pair of timing rollers 254 and 256 positioned within chamber 248 above cutting blade 236 and urged toward one another by suitable spring means. The processing time for each sandwich is controlled by the rotation of rollers 254 and 256 at a substantially uniform predetermined speed which is sufficient to advance a sandwich positioned between the rollers through chamber 248 toward passage 252 a distance equal to the accurately predetermined length of the sandwich during the predetermined processing period. In the operation of the device, the severed end of the sandwich adjacent blade 236 is inserted immediately following cutting into the bite of rollers 254 and 256, the latter being in constant rotation at a speed calculated to advance the sandwich completely between the rollers during the predetermined processing period.

Means are provided for advancing the end of a sandwich into the bite of timing rollers 254 and 256 immediately as the sandwich is cut to a predetermined length and, in the form shown, comprises elevator platform 234 having a curved end portion (not shown) extending beyond cutting blade 238, at which platform 234 is mounted for limited pivotal movement in a clockwise direction about an axis adjacent platform 234 and in substantially the same plane as the axis of rotation of blades 236 and 238. Following cutting of the sandwich, platform 234 is pivoted upward in a clockwise direction to elevate the end of a sandwich supported thereon to a position adjacent timing rollers 254 and 256. As a means for feeding the end portion of the sandwich into the bite of the rollers, there is provided an elevator roller 260 positioned slightly above the end of platform 234 adjacent cutting blade 238. Roller 260 is rotated in a clockwise direction, and as platform 234 is rotated upward the sandwich is brought into contact with roller 260 and is propelled thereby into the bite of timing rollers 254 and 256. The elevator platform is then returned to its former position to receive the next successive sandwich as the latter is advanced from between rollers 230 and 232.

Means are provided for ejecting each successive sandwich from processing chamber 248 through exit passage 252 when the predetermined processing period for each sandwich has elapsed. In the form shown, these means comprise a pair of ejection rollers 262 and 264 mounted at the end of chamber 248 adjacent passage 252. Ejection rollers 262 and 264 are resiliently urged toward one another by suitable spring means and are rotated at a more rapid speed than rollers 254 and 256 so as to rapidly advance a sandwich through passage 252 almost immediately as an edge of the sandwich is advanced into the bit of the rollers and engaged thereby. Ejection rollers 262 and 264 are so positioned with respect to the timing rollers 254 and 256 that the leading edge of a sandwich advanced between rollers 254 and 256 is engaged by rollers 262 and 264 just prior to advancement of the trailing edge of the sandwich out of engagement with rollers 254 and 256. In this manner ejection rollers 262 and 264 grab the leading edge of each sandwich and then cooperate with timing rollers 254 and 256 to eject the sandwich from chamber 248 at the moment when it is released by the timing rollers. A plurality of sandwiches arranged in a stacked relation with the leading edge of each successive sandwich spaced slightly behind the edge of the sandwich immediately above may be advanced between rollers 254 and 256 at the same time and advanced one at a time into the bite or rollers 262 and 264. As a means for guiding a sandwich from rollers 254 and 256 into the bite of rollers 262 and 264, there is provided a support plate 266 extending from adjacent roller 254 to a point adjacent roller 262 and having an upper support surface disposed in a plane substantially tangent to said rollers at their upper surfaces. Additionally, upper housing wall 250 converges toward plate 266 adjacent roller 264 to guide the sandwiches between the latter and roller 262. Means may be provided for rendering passage 252 light-tight and in the form shown comprise curved portions 268 of the walls of housing 210 defining the passage and adapted to conform to the peripheries of rollers 262 and 264. The rollers are mounted closely adjacent curved portions 268 and the latter are provided with pads 270 of a tufted fabric, felt or the like, adapted to bear against the surfaces of the rollers and prevent the admission of light between the rollers and portions 268.

The speed at which successive sandwiches are advanced between rollers 254 and 256 is substantially constant and is a function of the predetermined processing time. On the other hand, the frequency at which successive frames of sheet 212 may be exposed is independent of the time required for processing and may be varied at will. For this reason, when processing requires a relatively long period and successive exposures are made to comparatively rapid frequency, it may be necessary to advance a considerable number of successive sandwiches through processing chamber 248 and between timing rollers 254 and 256 at one time. In order to accommodate a large number of sandwiches in stacked relation and advance the sandwich at a constant predetermined speed, timing rollers 254 and 256 are so mounted as to permit their separation and means are provided for driving both of said rollers at constant angular velocity regardless of the amount of their separation. The last-mentioned means for mounting and driving timing rollers 254 and 256, together with drive and control means for operating the other components of the camera mechanism, are described in detail in U.S. Pat. No. 2,873,657. This drive and control means includes means for arresting the movement of the sandwich upon advancement of a predetermined length thereof between pressure rollers 230 and 232 and is so constructed and arranged as to arrest movement of the sandwich when one frame of sheet 212 and an image-receiving area of sheet 214, with which it is registered, have advanced into processing chamber 248 and a frame of sheet 212 is in position for exposure on the surface of guide plate 224.

In order to adapt it for use in the illustrated embodiment, sheet 214 may be provided with regularly spaced pairs of configurations, preferably apertures, the openings in a pair being located at the opposite edges of sheet 214 and one pair being associated with one image-receiving area. The control means includes a bearing member 276 located adjacent rollers 230 and 232 and having a bearing surface across which sheet 214 is adapted to move. The surface of member 276 is provided with a pair of grooves or slots 278 over which the pairs of apertures are adapted to move in aligned relation, thus permitting a pair of stop pins 280 mounted in alignment with groove 278 to project into a pair of apertures in sheet 214 when the apertures become aligned with the pins during the advancement of the sheet. Pins 280 are mounted for limited movement in the direction of advancement of sheet 214 and in a direction of advancement of sheet 214 and in a direction substantially perpendicular to the plane of said sheet as it is advanced across bearing member 276. Resilient means are provided for urging pins 280 into contact with sheet 214 and in a direction opposite the direction of advancement of the sheet. As a pair of apertures become aligned with the pins and the latter are moved in the direction of advancement of the sheet, suitable means, responsive to the movement of the pins, are effective to discontinue the rotation of rollers 230 and 232.

Sheet 214 is supplied from spool 218 and is advanced intermittently a substantially rapid rate between rollers 230 and 232 and, because any sudden advancement of this character directly from spool 218 may cause the sheets to be subjected to considerable strain due to the necessity of overcoming the inertia of the spool and the sheet coiled thereon, it is desirable to provide means for advancing sheet 214 from supply spool 218 in a manner which is slower and more continuous than the manner in which it is advanced between rollers 230 and 232. The sheet is advanced by the last-mentioned means into a take-up loop 282 from which it may be drawn suddenly and rapidly between rollers 230 and 232. This sheet-advancing means comprises a pair of feed rollers 284 and 286 mounted in the lower portion of housing 210 below supply spool 218. At the start of a processing cycle, take-up loop 282 is of sufficient length to permit the sudden and rapid advancement of an image-receiving area of sheet 214 with its associate container 220 between rollers 230 and 232, and feed rollers 284 and 286 are preferably already in motion. As a means for controlling the length of sheet 214 advanced into loop 282, there is provided a bearing member 288, located adjacent roller 286, below supply spool 218 and above the path of sheet 214, and having a bearing surface across which sheet 214 is adapted to move. The bearing surface of member 288 is provided with a pair of grooves or slots 290 over which a pair of apertures in sheet 214 are adapted to move in aligned relation, thus permitting a pair of stop pins 292 to project into a pair of apertures in sheet 214 when the apertures become aligned with the pins during movement of the sheet. Pins 292 are so mounted as to be movable by engagement with a pair of apertures in sheet 214, and means responsive to the movement of the pins are provided for arresting the rotation of feed rollers 284 and 286.

The drive and control means described in the aforementioned U.S. Pat. No. 2,873,657, also includes means for withdrawing stop pins 280 and 292 from engagement with apertures in sheet 214 and, in addition thereto, includes means for operating the processing timing rollers, elevator roller, elevator platform and cutting means. Ejection roller 264 is driven continuously and ejection rollers 262 and 264 are so positioned with respect to timing rollers 254 and 256 that one end of a sandwich is engaged by the ejection rollers while the other end of the sandwich is still in engagement with the timing rollers. This structure insures engagement of a sandwich by the ejection rollers and in order to prevent damage to the sandwich or premature withdrawal from between the timing rollers when the ejection rollers suddenly grasp the sandwich, roller 264 is driven through a slip clutch which permits the ejection rollers to stop rotating momentarily or to rotate at the same speed as the timing rollers during the period when the sandwich is engaged at its ends by both pair of rollers.

In operation, the operative cycle is substantially automatic and begins with the rotation of loop feed rollers 284 and 286 immediately prior to or during exposure. As rollers 284 and 286 commence to advance sheet 214 into take-up loop 282, which is already of sufficient length to permit a withdrawal of an image-receiving area therefrom, stop pins 292 are withdrawn from the perforations with which they were engaged and move to a position wherein they are capable of being engaged by the next successive pair of perforations to arrest the rotation of rollers 284 and 286. Immediately following the exposure of a frame of photosensitive sheet 212, pressure rollers 230 and 232 are so driven as to superpose a frame of sheet 212 with an image-receiving area of sheet 214 and spread processing liquid from the container 220 associated with the image-receiving area between the frame and area to form a sandwich which is advanced by the rollers into processing chamber 248 onto platform 234. As the sheets are advanced between rollers 230 and 232, stop pins 280 ride on the surface of sheet 214 until they become aligned with a pair of apertures in the sheet whereupon they are engaged by the apertures and are carried forward by the sheet to discontinue the rotation of rollers 230 and 232. The drive mechanism is then effective to so rotate the cutting blades 236 and 238 as to cut the sandwich adjacent the ends of the superposed frame and area and thereby sever the portion of the sandwich containing the frame and area from the end portion of the sandwich, including a ruptured container 220, the remaining portions of the sandwich extending between rollers 230 and 232. Elevator roller 260, timing rollers 254 and 256 and ejection rollers 262 and 264 are driven continuously. Following cutting of the sandwich, elevator platform 234 is pivoted upward to bring the sandwich positioned thereon into contact with roller 260 to advance the sandwich into the bite of timing rollers 254 and 256, whereupon elevator platform 234 is returned to its original position for receiving the next successive sandwich. Timing rollers 254 and 256 rotate at a substantially uniform speed calculated to advance each sandwich through chamber 248 into the bite of ejection rollers 254 and 256 at the end of a predetermined processing period. The ejection rollers immediately eject the sandwich from the processing chamber whereupon the image-receiving area of sheet 214 is stripped from the frame of sheet 212 with which it is superposed.

Various methods and apparatus may be provided for separating sheets 212 ans 214, comprising a sandwich, as the latter is ejected from processing chamber 248 by ejection rollers 262 and 264. In the form shown, this type of apparatus comprises a pair of endless belts 294 and 296 which are at least as wide as sheets 212 and 214. Each belt is provided with a multiplicity of perforations (not shown) so that a sheet may be held in contact with the forward surface of each belt by reducing the air pressure on the rear surface of the belt and the surfaces of each belt are formed of a material such as a soft rubber or the like capable of snugly seating a sheet adhered thereto by atmospheric pressure and of generating sufficient friction between the belt surface and the sheet to move the latter with the belt.

Belt 294 is supported between a pair of support rolls 300 and 302 and belt 296 is supported between support rolls 304 and 306. Rolls 300 and 304 are mounted in juxtaposed relation with their axes parallel and the belts 294 and 296 supported in facing relation and preferably in face-to-face contact. Rolls 300 and 304 are so positioned adjacent ejection rollers 262 and 264 that each sandwich is fed by the last-mentioned rollers between belts 294 and 296 as they pass around and between support rolls 300 and 304. The two belts are moved in superposed relation in the direction of advancement of the sandwich by support rolls 300 and 304 and may, for example, be advanced at the same speed the sandwich is advanced by the ejection rollers.

As a means for reducing atmospheric pressure on the rear surfaces of belts 294 and 296, there are provided vacuum chambers 308 and 310 located between support rolls 300 and 302 with the forward peripheries of their walls in contact with the rear surface of belt 294 and a vacuum chamber 312 located between support rolls 304 and 306 with the forward peripheries of its walls in contact with the rear surface of belt 296. Vacuum chambers 308 and 310 include, respectively, end walls 314 and 316 positioned, respectively, adjacent support rolls 300 and 302 and shaped to conform to the peripheries of the rolls so that the pressure on the belt 294 may be reduced at a point as closely adjacent each roller as possible. The two vacuum chambers 308 and 310 have a common dividing wall 318 and a common rear wall 320. The forward edges of the side walls of chambers 308 and 310 are in a plane substantially tangent to the surfaces, of support rolls 300 and 302 and a suitable suction means is provided for reducing the pressure in chambers 308 an 310. If desired, this structure may be modified to provide more than two vacuum chambers, and chambers 308 and 310 are therefore shown only for purposes of illustration.

Support rolls 304 and 306 are positioned substantially closer together than are support rolls 300 and 302 and a vacuum chamber 312, similar in many respects to chambers 308 and 310 but shorter than the other chambers and including end walls 322 and 324 shaped to conform to the surfaces of support rolls 304 and 306 and a rear wall 326, is positioned between support rolls 304 and 306. Support roll 306 is so positioned that a plane through the axes of support rolls 304 and 306 is at an angle with a plane through the axes of support rolls 300 and 302. The forward edge portions of the side walls of chamber 312 are tangent with the surfaces of support rolls 304 and 306 but are so formed as to support a portion of belt 296 adjacent roll 304 in parallel facing relation with belt 294 and to allow the portion of belt 296 adjacent roll 306 to curve away from belt 294. By virtue of this arrangement, a sandwich comprising sheets 212 and 214 is fed between the parallel portions of belts 294 and 396 and the pressure differential between the front and rear of the belts is effective to hold sheet 214 in contact with belt 294 and sheet 212 in contact with belt 296. As the belts advance and belt 296 curves away from belt 294, the two sheets are held in continued contact with the belts and are thereby separated from one another. In the form shown, following separation of the two sheets, sheet 212 is guided around roll 306 by a curved guide member 328 and sheet 214 is held and advanced in contact with belt 294.

To insure that sheet 214 is retained in contact with belt 294 as the belt and sheet are advanced in the direction of roll 302, there may be provided such means as a pair of pad rollers 330 mounted in engagement with the belt at the rear wall so as to bear on the margins of each sheet 214 as it is advanced. Pad rollers 330 are resiliently urged toward belt 294 at wall 318 and are formed preferably of some yielding material such as rubber or the like so that they are deformed, when in contact with sheet 214, and thereby provide a greater surface area in contact with the sheet more capable of spanning the edge of wall 318 separating chambers 308 and 310. Another pair of pad rollers (not shown) may be positioned adjacent roll 302, if desired.

Following separation of sheet 312 from sheet 314 containing a silver transfer image, sheet 214 is advanced along belt 294 in the direction of roll 302 to apparatus for applying an aqueous medium to effect removal of the silver image and corresponding areas of the silver-receptive stratum of sheet 214. Viewing means shown at 332 in the form of a conventional optical system is preferably provided at some intermediate point for viewing and inspection of the silver image prior to treatment with the aqueous medium. Means (not shown) may be provided for stopping the advancement along belt 294 for viewing. Various means may be employed for applying the aqueous medium to effect the desired removal. Such means preferably includes a soft porous applicator for rubbing or wiping the surface of sheet 214. This wiping action may be in a continuous direction or a reciprocating back-and-forth wiping motion may be employed. In the form shown in FIG. 5 (similar to that shown in FIG. 4), the means for applying the aqueous medium includes a tank or other container 334 having a suitable quantity of aqueous fluid 336. Porous wiping brushes or rollers 338 and 340 are partially immersed in fluid 336 and rotatable therewithin so that they are constantly wetting with the fluid. These brushes or rollers, which are of at least the same width as the image area of sheet material 214, are positioned so as to contact the entire image area as the sheet material is advanced along belt 294 towards roll 302.

Following treatment on belt 294 with the aqueous medium to effect removal of silver and corresponding area of the silver-receptive stratum, the resulting printing master is conveyed from belt 294 through rollers 342, as shown somewhat schematically in FIG. 6, with the aid of guide plates 344 and 346 to a roller 348 where it is affixed by suitable clamping means 350. In known manner an inking roller 352 cooperating with an adjacent roller 354 is provided to effect inking of the thus affixed printing master with ink 356 from a source 358. Another roller 360 of rubber or the like is also provided in juxtaposition with roller 348 to receive ink from the master. To provide ink reproductions on copy paper from a source 362, roller 348 and roller 360 are set into operation in the directions shown by the arrows by suitable actuating means conventional in the art (not shown), causing the inking master on roller 348 to receive ink from roller 352 which is in turn transferred to roller 360. Drive feed means 364 is then actuated to cause copy paper from source 362 to be fed successively against the thus inked roller 360. A suitable roller or like element 366 is provided to insure intimate contact of the copy paper with roller 360, thereby in turn insuring transfer of ink to the copy paper to provide an ink reproduction of the original. A collecting bin 368 is preferably provided to receive the copy sheet bearing the ink reproductions.

Following completion of the inking cycle, i.e., after the desired number of copies have been run off, the master may be recovered from roller 348 and stored for further use.

The aforementioned apparatus is susceptible to many variations in the arrangement of elements and is, therefore, intended only for purposes of illustration. For example, it is contemplated that the various other means for applying the precessing composition heretofore known in the art may be employed in lieu of containers 220 containing the same. Various other means for applying the aqueous medium to provide the printing master will also be readily suggested to those skilled in the art in the light of this disclosure. While the apparatus shown in the drawing and described above has for purposes of illustration employed rolls of continuous sheet material it will be appreciated that in lieu thereof it may be modified to use individual sheets for each print and resulting inking master, thereby obviating the need for knife means for the subsequent severing of the sheet from the roll.

Where single copies are desired wherein the inking master becomes the primary image, as described previously, the apparatus may be modified so that roller 348 becomes a pressure roller for pressing the sheet against ink roller 352 to transfer the ink thereto. Following this inking the sheet material may then be recovered as a single ink reproduction instead of being employed as an inking master in the preparation of successive ink copies on copy sheets.

The inking apparatus shown in FIG. 6 is in general of known structure. Accordingly, for purposes of simplicity the conventional means for applying a fountain solution to facilitate selective inking, e.g., as described in the illustrative examples, has not been shown.

In the apparatus shown for purposes of illustration in FIGS. 4 and 5 and described above, reference has been made to systems utilizing two sheet materials to effect image formation. In one form, these sheet materials comprise a photosensitive element including a light-sensitive silver halide emulsion and an image-receiving element including a silver-receptive stratum. Image formation is obtained, following photo-exposure of the photosensitive element, by applying a processing composition and developing while the respective elements are in superposition to form a silver transfer image on the image-receiving element. In another form, unitary film unit such as shown in FIG. 3 is employed. In this instance, this film unit comprises one of the sheet materials and the other sheet material is a cover or spreader sheet to facilitate spreading of the processing composition. The apparatus previously described is adaptable or can be readily rendered adaptable for use with either of these forms which can be defined as a "two sheet" system. Various systems employing a one sheet system are also known in the art. In such systems, a firm unit including a silver halide emulsion layer disposed over a silver-receptive stratum, the said layer and strata being contained on a common support member, is exposed and then developed by contacting the surface of the exposed emulsion layer with a processing fluid and premitting this fluid to permeate through the emulsion layer to initiate development and thereby to form the silver transfer image. Following development, the emulsion layer is removed to reveal the silver transfer image on the silver-receptive stratum. To facilitate clean removal of the emulsion layer along with the spent processing fluid, stripping layers may be employed. It is also contemplated that the emulsion layer may be removed by washing, e.g., with a separate washing solution or by the same treatment by which the image silver is removed, i.e., in a single treatment with an aqueous fluid. In any event, apparatus useful in the practice of this invention also includes the apparatus heretofore employed for single sheet exposure and development systems in combination with image removal means and inking means such as shown in FIG. 4–6. As examples of such single sheet systems, wherein a processing composition is applied to a single sheet including an exposed silver halide emulsion, mention may be made of those described and claimed in the U.S. Pat. No. 3,507,650 issued to Edwin H. Land and U.S. Pat. No. 3,473,459 issued to Richard J. Chen and Nicholas Gold.

Other changes and variations of apparatus useful in the practice of this invention will also be readily apparent in the light of this disclosure.

A silver print treated to effect removal of silver and corresponding areas of the silver-receptive stratum in accordance with this invention may subsequently be employed to provide the primary image or reproduction in terms of color providing materials other than ink. In such procedures wherein differential in ink receptivity is not essential, obviously the hydrophobic underlayer may be eliminated if desired.

In one such procedure, the silver-receptive stratum and the underlayer upon which it is positioned, may have a differential affinity for a color providing material other than ink. The underlay may, for example, be a dyeable stratum, e.g., a continuous film containing a dye mordant such as may be employed in procedures for preparing dye images heretofore known in the art. In areas where the surface of this underlayer is exposed by removal of the silver-receptive stratum, selective dyeing may occur upon contact with a dye solution to provide a dye image.

It is contemplated that reproduction may also be accomplished in terms of a color providing material present initially in the image-receiving element. For example, a layer of material of the desired color may be present beneath the silver-receptive stratum. This material is normally not visible through the silver-receptive stratum, at least to any appreciable extent. However, following imagewise removal of areas of the silver-receptive stratum, the color providing material is revealed to provide the desired image. It will be apparent that this aspect of the invention eliminates the need of application, following treatment of the silver image, of an ink or other color providing material.

The color providing material need not possess the desired color in the form in which it is present in the underlayer. It may, for example, be of the class of compounds which are substantially colorless or which change color upon a change in environment, e.g., pH-sensitive compounds, so that by appropriate treatment the desired color is obtained. The color providing material may be incomplete dye, e.g., a color coupler which is reactable to form a dye, so that by treatment of the relief with an appropriate solution of the desired reactant, dye formation is obtained. Various materials of this nature are well known in the art and per se comprise no part of this invention.

Other procedures for preparing single copies may be apparent to those skilled in the art in the light of this disclosure. The common denominator to all of the embodiments contemplated by this invention is the selective removal of silver and corresponding areas of the silver-receptive stratum. It is, accordingly, to be expressly understood that a silver transfer image so treated in accordance with this invention has separate utility in areas other than photomechanical techniques for preparing ink reproductions on copy paper or the like.

While reference has been made in the foregoing description to the preparation of single color ink reproductions, it is within the scope of this invention to utilize two or more inking masters prepared in according with this invention to prepare multicolor ink reproductions.

By way of recapitulation, this invention provides a unique and simple method of providing images suitable for use in offset printing or other differential inking or coloring processes.

This invention is based upon the discovery that, in silver diffusion transfer systems of the foregoing description wherein so much silver is packed into the silver image areas of the silver transfer print that the matrix within which the silver is deposited may be readily ruptured, if not actually ruptured during silver deposition, inclusion of an anti-adhesion reagent for penetrating the interstices of these ruptured areas of the matrix and selectively precluding adhesion thereof to an underlying layer will effect ready removal of those areas of the matrix within which silver is deposited when contacted with an aqueous medium, e.g., ordinary tap water, so as to uncover the underlying layer. This removal is facilitated by lightly rubbing with a damp facial tissue or some other applicator containing the aqueous medium. Where the underlying layer is of a different wettability or inkability from the hydrophilic silver-receptive stratum, i.e., comprises a layer of a hydrophobic material, an inking master capable of providing hundreds of ink reproductions of exceptional quality is provided.

Where the silver-receptive stratum is composed of a siliceous matrix, it has been found that excellent results are obtained where this stratum was approximately one micron or less in thickness and the reflection density of the transferred silver is in excess of 1.0. In the most useful embodiments, the silica layer was about 0.5 to 0.75 microns thick. The amount of silver required to give such reflection densities is so densely packed into such extremely thin silica layers that the matrix is readily rupturable by even very light pressure, such as wiping with a wet facial tissue, placing under running water, or a few revolutions on the drum of an offset printing machine while in contact with an offset printing conditioning solution. The provision of an anti-adhesion reagent, as discussed above, facilitates the rupture and layerwise removal of the silver image areas.

It will be recognized that the particular quantity of silver which must be deposited within a silver-receptive stratum to obtain imagewise rupture and layerwise removal will vary, e.g., with the size of the deposited silver grains, the efficiency of the antiadhesion reagent, and/or the nature of the matrix material, and that the requisite thickness and density relationship for any given combination of materials may be readily determined by simple experimentation. As noted above, it is desired to remove the silver-receptive matrix layerwise, i.e., throughout its depth or thickness, so that the surface of an underlying layer is exposed for contact with subsequent process solutions, e.g., an ink solution which preferentially wets either the thus exposed (i.e., uncovered) surface of the underlying layer or the exposed surface of the remaining portions of the silver-receptive stratum. [It will be noted that this layerwise removal of the silver-receptive stratum is in contrast to the requirement in Land et al. U.S. Pat. No. 3,220,837 (discussed above) that the transferred silver be deposited in thin but essentially continuous dense masses primarily at the surface of the image-receptive stratum so that the image silver areas may be preferentially wetted by an oleophilic ink.]

The desired dense silver transfer images are facilitate by the use of high contract, line copy types of silver transfer materials. Since it is necessary to remove the silver-receptive stratum layerwise to expose the underlying stratum, techniques which encourage the deposition of silver deeper in the silver-receptive stratum are very helpful so that silver will be deposited closer to the interface between said strata; one technique to encourage such deeper deposits of silver is to distribute silver precipitating agents in the silver-receptive stratum so that the concentration of precipitating agent is lowest near the outer surface of said stratum and greatest near the inner surface of that stratum (see U.S. Pat. No. 3,567,442 issued to Edwin H. Land).

A particularly important aspect of this invention is the use of halftone screens to reproduce tone values which if exposed in a normal continuous tone exposure would record as low transfer image densities insufficient to effect the desired rupture and layerwise removal of the silver-receptive stratum. Exposure through a halftone screen has been found to give excellent and extremely faithful reproduction of full range step tablets, portraits and pictorial scenes, thus demonstrating the markedly enhanced ability to reproduce tone values by use of the halftone screen. Inking of the image so obtained, after rupture and layerwise removal of the silver image areas, gives photographic images of unusual quality. Such inked halftone images exhibit unusual tonal scale and extraordinary richness of tonal values, including densities higher than available in any silver reflection print, as well as greater image stability than a silver image. As noted from Example 8, the tiny ink dots providing the intermediate gradations were observed under a magnifying glass to be of exceptional fidelity, retaining their form and size.

Because this process provides a halftone printing master derived directly from the photosensitive element exposed in the camera, a positive print is obtained whose characteristic H & D Curve is a straight line with a slope approximating unity, thereby providing a highly faithful reproduction of the subject.

From the foregoing description and illustrative examples, it will be observed that the present invention provides a printing master capable of making ink reproductions of exceptional quality, not only of subject matter containing no intermediate gradations, e.g., line copy and the like, but also of continuous tone subject matter.

In addition to the exceptional quality of the printing masters prepared by this invention, an important advantage is the ease and simplicity by which the master is obtained. The silver transfer print from which the printing master is derived may be obtained in a single step according to known procedures employing a Polaroid Land Camera. Following preparation of the print employing these known techniques, one may obtain a printing master therefrom merely by applying an aqueous medium in the manner described prior to or after affixing the print to an offset printing device. No special chemicals are required to treat the silver print to obtain a printing master, ordinary tap water being sufficient. Moreover, no special skills or knowledge is required for this treatment, thereby increasing the number of potential users in an organization.

In summation, the present invention provides a significant contribution to the art of photomechanical reproduction, providing in a matter of seconds an inking master which is capable of running off hundreds of copies of exceptional quality and fidelity. The present invention may be performed with conventional photographic and offset printing devices, requiring no further or additional skills by the worker.

The present invention is readily distinguishable from prior systems for preparing a printing master from a silver transfer image.

One such prior system is disclosed in Belgian Pat. No. 669,880 which involves the steps of forming a silver transfer image and thereafter bleaching and rinsing the image to provide a printing master. The present invention offers distinct advantages over this system, as heretofore discussed, particularly since the present invention provides a system which requires no additional chemical solutions, e.g., bleaching solution components, or such chemical treatment following image formation, to obtain a printing master of exceptional quality.

Another prior system is disclosed in U.S. Pat. No. 3,385,701. In this case etching solutions are required to remove the silver-receptive stratum unless the stratum matrix is water soluble or includes a water soluble component. Furthermore, an etching solution must still be used with such water soluble matrices as those of gelatin. In the present invention, water alone is sufficient to effect the removal of strata having water insoluble matrices. Elimination of the etching solution with its harsh chemical results in a much safer and simpler removal operation.

Since certain changes may be made in the above product, process and apparatus without departing from the scope of the invention herein involved, it is intended that all matter contained in the above description or shown in the accompanying drawings shall be interpreted as illustrative and not in a limiting sense.

What is claimed is:

1. A process comprising
   a. developing an exposed silver halide emulsion containing a developable image, with an aqueous alkaline processing composition, and forming, in terms of unexposed areas of said emulsion, as a function of said development, an image-wise distribution of a soluble silver complex;
   b. transferring said complex at least in part by imbibition, to a superposed silver-receptive stratum including a hydrophilic, essentially water-insoluble macroscopically continuous siliceous matrix disposed on a layer of hydrophobic material, said silver-receptive stratum and said layer of hydrophobic material comprising an image-receiving element to provide a relatively dense silver transfer image primarily within said stratum, said silver transfer image formation being carried out in the presence of an effective amount of an anti-adhesion reagent which precludes adhesion of said stratum to said hydrophobic layer thereneath in areas of relatively dense silver deposit so that nonadhering areas of said stratum with the silver deposited therein may be removed by the application of an aqueous medium consisting essentially of water; and
   c. contacting said silver-receptive stratum containing said silver transfer image with an aqueous medium consisting essentially of water for a time sufficient to remove those of areas of said stratum containing relatively dense silver deposits.

2. A process as defined in claim 1 wherein said aqueous medium is applied while the silver-receptive stratum is still moist from the application of the processing composition.

3. A process as defined in claim 1 wherein said step of contacting said silver transfer image with an aqueous medium is accompanied by lightly rubbing said silver-receptive stratum.

4. A process as defined in claim 1 wherein a hydrophilic ink is applied to the surface of said image-receiving element subsequent to the removal of those areas of the silver-receptive stratum containing relatively dense silver deposits so as to ink only the remaining areas of said silver-receptive stratum.

5. A process as defined in claim 4 wherein said inked element is pressed against a sheet material to impart to said sheet material a positive ink reproduction.

6. A process as defined in claim 1 wherein said silver-receptive stratum is oleophobic and said layer of hydrophobic material is oleophilic, and an oleophilic ink is applied to the surface of said image-receiving element subsequent to the removal of those areas of the silver receptive stratum containing relatively dense silver deposits so as to ink only the areas of said element where the silver-receptive stratum has been removed to expose the olephilic underlayer.

7. A process as defined in claim 6 wherein an olephilic material is used to inscribe on the surface of said image-receiving element at some time prior to said inking step.

8. A process as defined in claim 6 wherein a pressure-providing marking instrument is used to inscribe on the surface of said image-receiving element at some time prior to said inking step to remove the silver-receptive stratum in the inscribed areas and expose the oleophilic underlayer, thereby render said inscribed areas wettable with an oleophilic ink.

9. A process as defined in claim 6 wherein said inked element is pressed against a sheet material to impart to said material a positive ink reproduction.

10. The process of claim 1 wherein said silver-receptive stratum is approximately 1 micron or less in thickness and comprises colloidal silica, said anti-adhesion reagent is selected from sequestering agents, wetting agents and detergents, and a silver transfer image having at least a 1.0 reflection density is formed.

11. The process as defined in claim 10 wherein said exposed silver halide emulsion has been exposed through a halftone screen.

12. A process as defined in claim 10 wherein said anti-adhesion reagent is contained in said processing composition and said layer of hydrophobic material comprises a layer of polyvinyl butyral.

13. A process as defined in claim 1 wherein said exposed silver halide emulsion has been exposed to continuous tone subject matter through a halftone screen to provide said developable image, said silver-receptive stratum is oleophobic and said layer of hydrophobic material is oleophilic, and said element is selectively inked with an oleophilic ink at some time subsequent to the removal of those areas of the silver-receptive stratum containing relatively dense silver deposits and thereafter the thus inked element is pressed against a sheet material to impact thereto a positive continuous tone ink reproduction of said subject matter.

14. A process as defined in claim 1 wherein said silver-receptive stratum and said layer of hydrophobic material have a differential affinity for color-providing material, color-providing material is applied to the surface of said image-receiving element subsequent to the removal of those areas of the silver-receptive stratum containing relatively dense silver deposits so as to selectively color said element in correspondence with the silver transfer image formerly deposited therein.

15. A process as defined in claim 14 wherein said color-providing material is a dye and said layer of hydrophobic material contains a mordant for said dye.

16. A process as defined in claim 1 wherein said layer of hydrophobic material contains color-providing material rendered visible upon imagewise removal of the silver-receptive stratum.

17. A process as defined in claim 16 wherein said color-providing material is a dye.

* * * * *